United States Patent [19]
Hase et al.

[11] Patent Number: 5,419,844
[45] Date of Patent: May 30, 1995

[54] PIEZOELECTRIC CERAMICS

[75] Inventors: Kiyoshi Hase; Akira Ando; Yasunobu Yoneda, all of Nagaokakyo, Japan; Toshihiko Kittaka, deceased, late of Ibaraki, Japan, by Kimiyo Kittaka, Ayumi Kittaka, Megumi Kittaka, heirs

[73] Assignee: Murata Manufacturing Co., Ltd., Kyoto, Japan

[21] Appl. No.: 81,480

[22] Filed: Jun. 23, 1993

[30] Foreign Application Priority Data

Jun. 23, 1992 [JP] Japan .................................. 4-189961
Jun. 23, 1992 [JP] Japan .................................. 4-189962
Jun. 23, 1992 [JP] Japan .................................. 4-189963

[51] Int. Cl.$^6$ .......................................... C04B 35/472
[52] U.S. Cl. ................................ 252/62.9; 501/136; 501/138; 501/139; 501/152
[58] Field of Search ............... 501/136, 138, 139, 152; 252/62.9

[56] References Cited

U.S. PATENT DOCUMENTS 4,184,971  1/1980  Tanaka et al. ................ 252/62.9
4,226,827  10/1980 Nishida et al. ............... 252/62.9

FOREIGN PATENT DOCUMENTS 0012583  6/1980  European Pat. Off. ...... C04B 35/49
0328290  8/1989  European Pat. Off. ...... H01L 41/18
1170307  11/1969 United Kingdom ......... C04B 35/46
2028791  3/1980  United Kingdom ......... C04B 35/49

OTHER PUBLICATIONS

Patent Astracts of Japan, vol. 12, No. 196 and JP-A-6-2-298192, Jun. 7, 1988.

*Primary Examiner*—Mark L. Bell
*Assistant Examiner*—Deborah Jones
*Attorney, Agent, or Firm*—Ostrolenk, Faber, Gerb & Soffen

[57] ABSTRACT

Disclosed herein are piezoelectric ceramics composed of lead titanate zirconate, which is expressed in $PbZr_{1-z}Ti_zO_3$, where $z=0.45$ to $0.54$, with $0.1$ to $8$ mole percent of the Pb atoms being replaced with at least one element selected from a group of Ca, Sr and Ba, and containing Mn in a range of 0.005 to 0.9 percent by weight of the whole in terms of $MnO_2$.

11 Claims, 2 Drawing Sheets

PIEZOELECTRIC CERAMICS

BACKGROUND OF THE INVENTION

1. Field of the Invention

The present invention relates to piezoelectric ceramics which are applied to a piezoelectric device such as a ceramic oscillator, a ceramic filter or a ceramic discriminator, for example, and more particularly, it relates to piezoelectric ceramics which are applied to a surface mounted type piezoelectric component, for which heat resistance is required.

2. Description of the Background Art

In general, piezoelectric ceramics which are mainly composed of lead titanate zirconate ($Pb(Ti_zZr_{1-z})O_3$) are widely applied to a ceramic filter or the like. Further, there are proposed piezoelectric ceramics, to which small amounts of various additives are added fop improving piezoelectric characteristics thereof.

In particular, piezoelectric ceramics which are applied to a ceramic piezoelectric filter having a flat group delay time (hereinafter referred to as GDT) characteristic and small phase distortion must have a small mechanical quality factor Qm. As to such piezoelectric ceramics having a small mechanical quality factor Qm, known are piezoelectric ceramics which are prepared by adding niobium oxide, antimony oxide or tantalum oxide to lead titanate zirconate ($Pb(Ti_zZr_{1-z})O_3$), or that prepared by partially replacing Pb atoms of lead titanate zirconate with a rare earth element.

On the other hand, a material which is prepared by diffusing Mn in $Pb(Zr_{0.52}Ti_{0.48})O_3$ is reported a piezoelectric ceramic containing a small amount of component diffused therein (M. Takahashi and S. Takahashi; Japan, J. Appl. Phys. Vol. 9, No. 8, pp. 1006 (1979)).

However, the aforementioned conventional piezoelectric ceramic having a small mechanical quality factor Qm is generally increased in piezoelectric constant d to be applied to an actuator, or mainly aimed at increasing an electromechanical coupling factor K for application to a broad-band filter. Thus, such piezoelectric ceramics generally have a low Curie temperature and insufficient heat resistance.

Some of the aforementioned conventional piezoelectric ceramics having small mechanical quality factors Qm have a high Curie temperature. When the temperature is increased in a soldering step or the like, however, the electromechanical coupling factor K is reduced to cause extreme displacement of resonance and antiresonance frequencies if electrodes provided across the piezoelectric ceramics are not short-circuited but opened.

When such a conventional piezoelectric ceramic having a small mechanical quality factor Qm is applied to a surface mounted type filter element, therefore, the filter characteristics are extremely deteriorated upon exposure to a high temperature of about 250° C. in a reflow soldering step.

Further, the aforementioned material prepared by diffusing Mn in $Pb(Zr_{0.52}Ti_{0.48})O_3$ is unsuitable for a filter element due to high temperature dependence of resonance and antiresonance frequencies.

SUMMARY OF THE INVENTION

In order to overcome the aforementioned disadvantages, an object of the present invention is to provide a piezoelectric ceramic, which is provided not only with a small mechanical quality factor Qm but with excellent heat resistance and suitably employed for a filter element having a flat group delay time characteristic and small phase distortion to be applicable to surface mounting.

The present invention has been proposed in order to solve the aforementioned problems. According to a wide aspect of the present invention, provided is a piezoelectric ceramic which is expressed in $PbZr_{1-z}Ti_zO_3$, where z=0.45 to 0.54. Up to 8 mole percent of the Pb atoms is replaced with at least one element selected from a group of Ca, Sr and Ba, while the piezoelectric ceramics Contains Mn in a range of 0.005 to 0.9 percent by weight of the whole in terms of $MnO_2$. In the piezoelectric ceramic according to the present invention, 0.1 to 8 mole percent of the Pb atoms is replaced with at least one element selected from the group of Ca, Sr and Ba as described above, whereby the temperature coefficient of resonance frequency is reduced.

According to a specific aspect of the present invention, up to 5.0 mole percent of the $PbZr_{1-z}Ti_zO_3$ is further replaced with at least one element selected from a group of La, Ce, Pr, Nd, Sm, Eu and Gd, whereby the mechanical quality factor Qm is reduced.

According to another specific aspect of the present invention, at least one element selected from a group of Sb, Nb, W and Ta is added to the piezoelectric ceramic in a range of up to 2.9 percent by weight of the overall piezoelectric ceramics in terms of $Sb_2O_3$, $Nb_2O_5$, $WO_3$ and/or $Ta_2O_5$, whereby the mechanical quality factor Qm is reduced.

In the piezoelectric ceramic according to the present invention, Mn is contained in the range of 0.005 to 0.9 percent by weight in terms of $MnO_2$ as described above, whereby heat resistance is improved. This Mn is diffused to be contained in the piezoelectric ceramic after the same is fired. In other words, a ceramic which is composed of the elements excluding Mn is fired so that Mn is thereafter diffused in the as-obtained sintered body, to be contained therein in the aforementioned specific range. Due to such diffusion, the Mn exists in the grain boundary in a higher concentration than that in the grains of the piezoelectric ceramics.

According to the present invention, as hereinabove described, Mn is contained in the piezoelectric ceramic having a small mechanical quality factor Qm and a high Curie temperature by diffusion to exist in the grain boundary with relatively higher concentration, whereby resistivity of the piezoelectric ceramic is reduced. Therefore, the piezoelectric ceramic is prevented from reduction in polarization as described later, so that changes of resonance and antiresonance frequencies can be reduced also when the piezoelectric ceramic is applied to a filter.

When a polarized piezoelectric ceramic is heated and then cooled to the room temperature on standing, pyroelectric charges are generated in this piezoelectric ceramic. An electric field is applied by such pyroelectric charges in a direction opposite to that of polarization of the piezoelectric ceramic, to lower the degree of polarization.

According to the present invention, Mn is introduced into the piezoelectric ceramic, in order to quickly annihilate the pyroelectric charges and prevent reduction of the degree of polarization. Particularly when Mn is contained in the piezoelectric ceramic by diffusion at a temperature of 900° to 1100° C., for example, resistivity of the piezoelectric ceramic is reduced so that the pyroelectric charges are quickly discharged. Therefore, it is possible to effectively prevent the electric field, which is opposite to the direction of polarization, from application over a long time. Thus, it is possible to suppress reduction of polarization, so that changes of resonance and antiresonance frequencies can be reduced when the piezoelectric ceramic is applied to a filter element, for example.

When the piezoelectric ceramic according to the present invention is applied to a piezoelectric component, such as a piezoelectric filter, for example, which is surface-mounted by reflow soldering, it is consequently possible to reduce deterioration of characteristics caused by a high temperature of up to 250° C., particularly deviation in the passband of the filter and the reduction of the passband width, to sufficiently cope with surface mounting.

Due to the aforementioned specific composition according to the present invention, it is possible to obtain piezoelectric ceramics having a high electromechanical coupling factor K, small temperature changes of resonance and antiresonance frequencies, and a small mechanical quality factor Qm (not more than 100, for example).

When the inventive piezoelectric ceramic is applied to a ceramic filter (piezoelectric filter) element, therefore, it is possible to attain excellent characteristics including a flat group delay time (GDT) characteristic and small phase distortion over a wide frequency band, thereby suppressing bit errors with respect to digital signals. Thus, the piezoelectric ceramic according to the present invention is particularly significant as a material for a piezoelectric filter element for digital signals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
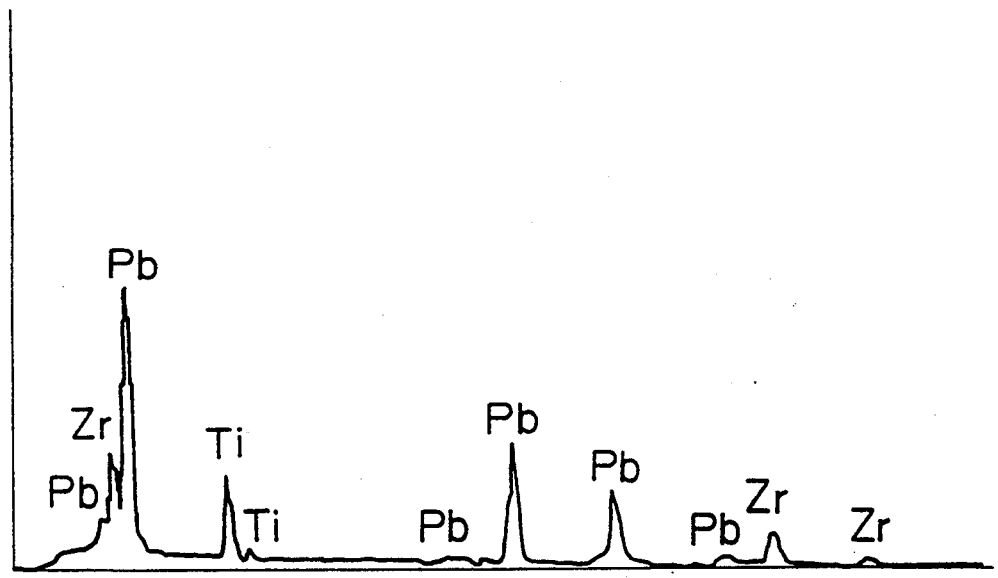
FIG. 1 illustrates an energy dispersive X-ray spectrum of grains in a sample No. 2 of piezoelectric ceramic according to Example 1 of the present invention.

Unlimited Examples of the present invention are now described, to clarify the present invention.

Example 1

Respective raw materials of PbO, $SrCO_3$, $La_2O_3$, $CeO_2$, $Pr_2O_3$, $Nd_2O_3$, $Sm_2O_3$, $Eu_2O_3$, $Gd_2O_3$, $TiO_2$ and $ZrO_2$ for forming a piezoelectric ceramic were weighed out to attain compositions shown in Table 1, and wet-blended in a ball mill. The mixtures obtained by such wet blending were dried and thereafter calcined at 800° to 900° C. for 2 hours. The calcined materials were wet-ground in a ball mill, to obtain mixed powder materials.

Caking additives such as water or polyvinyl alcohol were added to the mixed powder materials, which in turn were press-molded and thereafter fired at a temperature of 1150° to 1250° C. for 2 hours, to obtain discoidal samples of ceramics having diameters of 10 mm and thicknesses of 1 mm. These samples were coated with the mixture of $MnCO_3$ powder and varnish, and then dried. Thereafter the samples were heated at a temperature of 900° to 1100° C. for 2 hours, to be subjected to diffusion. Thereafter the samples were polished into thicknesses of 0.5 mm, and silver electrodes were applied at both ends of the samples. Thereafter the samples were polarized in insulating oil of 80° C. for 30 minutes with an electric field of 2 to 3 kV/mm, to obtain samples of piezoelectric ceramics (vibrator samples). For the purpose of comparison, samples of piezoelectric ceramics (vibrator samples) were prepared in a similar manner to the above, in ranges which were out of the scope of the present invention.

As to these samples, there was obtained specific resistance values $\rho$, electromechanical coupling factors Kp and mechanical quality factors Qmp in radial vibration, and temperature coefficients (expressed as Fr—TC) of resonance frequencies Fr at temperatures of $-20°$ C. to 80° C.

Further, these vibrator samples were introduced into a thermostat at 250° C. for 3 minutes to be subjected to heat treatment, extracted from the thermostat with the electrodes applied at both ends of the samples being in open states, and thereafter allowed to stand for about 1 hour. Then, changes $\Delta Fr$ and $\Delta Fa$ of resonance and antiresonance frequencies Fr and Fa were measured.

Table 1 shows the results of the as-measured characteristics, i.e., specific resistance values $\rho$, electromechanical coupling factors Kp, mechanical quality factors Qmp, temperature coefficients (Fr—TC) of resonance frequencies Fr, and changes $\Delta Fr$ and $\Delta Fa$ of the resonance and antiresonance frequencies Fr and Fa, of the respective samples.

Referring to Table 1, symbols A, x, B, y, z and $\alpha$ represent respective components and rates of addition thereof in the following formula:

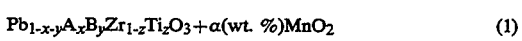

$$Pb_{1-x-y}A_xB_yZr_{1-z}Ti_zO_3 + \alpha(\text{wt. \%})MnO_2 \qquad (1)$$

Namely, A represents the types of the elements (at least one of Ba, Sr and Ca) substituting for Pb, and x represents rates (mole percent) thereof. On the other hand, B represents the types of the elements (at least one of La, Ce, Pr, Nd, Sm, En and Gd) substituting for Pb, and y represents rates (mole percent) thereof. Further, z represents rates (mole percent) of Ti, and $\alpha$ represents contents (percent by weight) of $MnO_2$ in the samples of piezoelectric ceramics.

Referring to Table 1, asterisks (*) show comparative samples of piezoelectric ceramics which were out of the scope of the present invention.

It has been recognized from the results of measurement of the respective samples shown in Table 1 and other samples (not shown in Table 1) that the temperature coefficients Fr—Tc of the resonance frequency Fr were disadvantageously increased when the amounts of replacement with A (Sr, Ba and/or Ca) were less than 0.1 mole percent, while the Curie temperatures were reduced and the changes ΔFr and ΔFa of the resonance and antiresonance frequencies Fr and Fa after heating were increased to deteriorate heat resistance when the amounts of replacement with A (Sr, Ba and/or Ca) exceeded 8 mole percent in total.

It has also been recognized that the Curie temperatures were reduced to deteriorate heat resistance when the amounts y exceeded 5.0 mole percent.

It has further been recognized that the electromechanical coupling factors Kp were reduced when the rates z of Ti exceeded 54 mole percent, while the Curie temperatures were reduced to deteriorate heat resistance when the rates z were less than 45 mole percent.

Comparing an inventive sample (e.g., the sample No. 2) with the comparative sample No. 1 which was out of the scope of the present invention, it is understood from Table 1 that the specific resistance (resistivity) ρ of the sample No. 2 according to Example 1 of the present invention was smaller by at least 1 figure than that of the comparative sample No. 1 containing no Mn.

Figure 2:
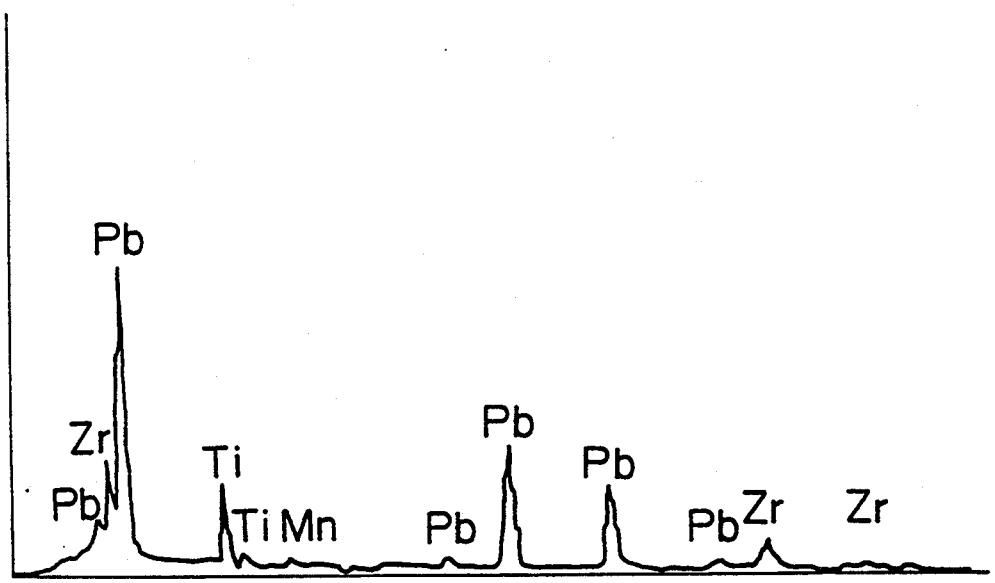
FIG. 2 illustrates an energy dispersive X-ray spectrum of grain boundary in the sample No. 2 of the piezoelectric ceramic according to Example 1 of the present invention.

As to the inventive sample No. 2, elements existing in grains and grain boundary were analyzed with an analytical electron microscope. FIGS. 1 and 2 illustrate the energy dispersive X-ray spectra of grain and grain boundary.

It is understood from FIGS. 1 and 2 that Mn which was introduced into the sample No. 2 by diffusion was distributed in the grain boundary at a higher concentration than that in the grain of the piezoelectric ceramic. In other words, it is understood that the specific resistance (resistivity) ρ of this piezoelectric ceramic was reduced due to such uneven distribution of Mn in the grain boundary of the piezoelectric ceramics.

It is also understood that the changes ΔFr and ΔFa of the resonance and antiresonance frequencies Fr and Fa after heating were extremely reduced as the result of such reduction of the specific resistance ρ, as shown in Table 1. Further, the mechanical quality factor Qmp of the sample No. 2 was substantially identical to that of the sample No. 1 containing no Mn, while its electromechanical coupling factor Kp was considerably larger than that of the sample No. 1. Thus, it is understood that the characteristics of the sample No. 2 were improved also in these points.

When the amount of Mn is less than 0.005 percent by weight in terms of $MnO_2$, sufficient effects cannot be attained as to improvement of the characteristics such as the specific resistance (resistivity) ρ and the frequency changes ΔFr and ΔFa, while the mechanical quality factor Qmp and the frequency changes ΔFr and ΔFa are disadvantageously increased when the amount of Mn exceeds 0.9 percent by weight. Therefore, the amount of Mn is preferably in a range of 0.005 to 0.9 percent by weight in terms of $MnO_2$.

Example 2

Respective raw materials of PbO, $SrCO_3$, $TiO_2$, $ZrO_2$, $Sb_2O_3$, $Nb_2O_5$, $WO_3$ and $Ta_2O_5$ for forming piezoelectric ceramics were weighed out to attain compositions shown in Table 2, and wet-blended in a ball mill. The as-obtained mixtures were subjected to steps absolutely identical to those of Example 1, to obtain vibrator samples of polarized piezoelectric ceramics. As to these samples, the respective characteristics, i.e., specific resistance values ρ, electromechanical coupling factors Kp, mechanical quality factors Qmp, temperature coefficients (Fr−TC) of resonance frequencies Fr and changes ΔFr and ΔFa of resonance and antiresonance frequencies Fr and Fa were measured similarly to Example 1. Table 2 shows the results.

Referring to Table 2, symbols A, x, B, z, α and β represent respective components and rates of addition thereof in the following formula (2) respectively:

$$Pb_{1-x}A_xZr_{1-z}Ti_zO_3 + \beta(wt.\ \%)B + \alpha(wt.\ \%)MnO_2 \quad (2)$$

Namely, A represents types of the elements (at least one of Ca, Sr and Ba) substituting for Pb and x represents rates (mole percent) thereof, while B represents types of the additives (at least one of $Sb_2O_3$, $Nb_2O_5$, $WO_3$ and $Ta_2O_5$) and β represents rates (percent by weight) thereof. Further, z represents rates (mole percent) of Ti, while α represents contents (percent by weight) of $MnO_2$.

Referring to Table 2, asterisks (*) show comparative samples of piezoelectric ceramics which were out of the scope of the present invention.

It has been recognized from the results of measurement of the respective samples shown in Table 2 and other samples (not shown in Table 2) that the temperature coefficients Fr−Tc were disadvantageously increased when the amounts of replacement with A (Sr, Ba and/or Ca) were less than 0.1 mole percent, while the Curie temperatures were reduced and the changes ΔFr and ΔFa of the resonance and antiresonance frequencies Fr and Fa after heating were increased to deteriorate heat resistance when the amounts of replacement with A (Sr, Ba and/or Ca) exceeded 8 mole percent in total.

It has also been recognized that the Curie temperatures were reduced to deteriorate heat resistance when the amounts β of B ($SbO_2$, $Nb_2O_5$, $WO_3$ and/or $Ta_2O_5$) exceeded 2.9 mole percent.

It has further been recognized that the electromechanical coupling factors Kp were reduced when the rates z of Ti exceeded 54 mole percent, while the Curies temperatures were reduced to deteriorate heat resistance when the rates z were less than 45 mole percent.

Comparing an inventive sample (e.g., the sample No. 22) with the comparative sample No. 21 which was out of the scope of the present invention, it is understood from Table 2 that the specific resistance (resistivity) ρ of the sample No. 22 according to Example 2 of the present invention was smaller by at least 1 figure than that of the comparative sample No. 21 containing no Mn.

Figure 3:
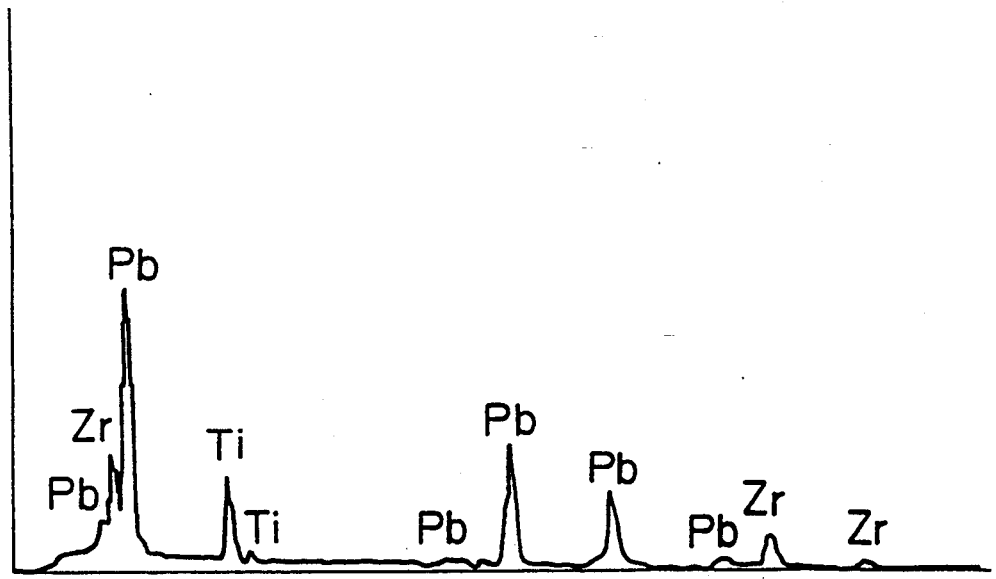
FIG. 3 illustrates an energy dispersive X-ray spectrum of grains in a sample No. 22 of piezoelectric ceramic according to Example 2 of the present invention.
Figure 4:
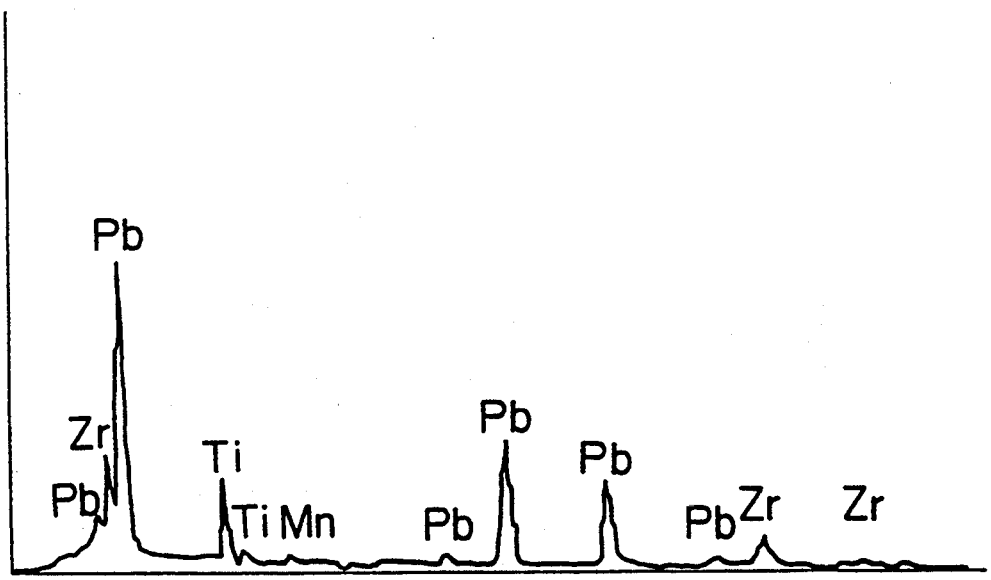
FIG. 4 illustrates an energy dispersive X-ray spectrum of grain boundary in the sample No. 22 of the piezoelectric ceramic according to Example 2 of the present invention.

As to the inventive sample No. 22, elements existing in grains and grain boundary were analyzed with an analytical electron microscope. FIGS. 3 and 4 illustrate the energy dispersive X-ray spectra of grains and grain boundary.

It is understood from FIGS. 3 and 4 that Mn which was introduced into the sample No. 22 by diffusion was distributed in the grain boundary at a higher concentration than that in the grain of the piezoelectric ceramics. In other words, it is understood that the specific resistance (resistivity) ρ of this piezoelectric ceramics was reduced due to such uneven distribution of Mn in the grain boundary of the piezoelectric ceramics.

It is also understood that the changes ΔFr and ΔFa of the resonance and antiresonance frequencies Fr and Fa after heating were extremely reduced as the result of such reduction of the specific resistance ρ, as shown in Table 2. Further, the mechanical quality factor Qmp of the sample No. 22 was substantially identical to that of the sample No. 21 containing no Mn, while its electromechanical coupling factor Kp was considerably larger than that of the sample No. 21. Thus, it is understood that the characteristics of the sample No. 22 were improved also in these points.

When the amount of Mn is less than 0.005 percent by weight in terms of $MnO_2$, sufficient effects cannot be attained as to improvement of the characteristics such as the specific resistance (resistivity) $\rho$ and the frequency changes $\Delta Fr$ and $\Delta Fa$, while the mechanical quality factor Qmp and the frequency changes $\Delta Fr$ and $\Delta Fa$ are disadvantageously increased when the amount exceeds 0.9 percent by weight. Therefore, the amount of Mn is preferably in a range of 0.005 to 0.9 percent by weight in terms of $MnO_2$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Piezoelectric ceramic of the composition $PbZr_{1-z}Ti_zO_3$, where z=0.45 to 0.54, 0.1 to 8 mole percent of said Pb atoms being replaced with at least one element selected from Ca, Sr and Ba,
   said piezoelectric ceramic containing Mn in a range of 0.005 to 0.9 percent by weight of the whole in terms of $MnO_2$ and
   said Mn existing at the boundary region of the ceramic particles at a higher concentration than in the ceramic particles of said piezoelectric ceramic.

2. Piezoelectric ceramic in accordance with claim 1, wherein an amount not exceeding 5.0 mole percent of said Pb atoms is replaced with at least one element selected from the group of La, Ce, Pr, Nd, Sm, Eu and Gd.

3. Piezoelectric ceramic in accordance with claim 1, wherein said at least one element selected from Sb, Nb, W and Ta is present in an amount not exceeding 2.9 percent by weight in terms of $Sb_2O_3$, $Nb_2O_5$, $WO_3$ and $Ta_2O_5$.

4. Piezoelectric ceramic in accordance with claim 1, in which 1–5% mole percent of said lead atoms are replaced with Sr and the amount of $MnO_2$ is 0.1–0.5 weight percent.

5. Piezoelectric ceramic in accordance with claim 4, in which z is 0.45–0.52 and in which 1–3% mole percent of said lead atoms are replaced with Ce, Pr, Nb, Sm, Eu or Gd.

6. Piezoelectric ceramic in accordance with claim 1, in which 2 mole percent of said lead atoms are replaced with a combination of Ba and Ca and 3 mole percent of said lead atoms are replaced with a combination of Ce, Nb and Sm.

7. Piezoelectric ceramic in accordance with claim 3, where z is 0.47–0.52, 1–5 mole percent of said lead atoms are replaced with Sr, the amount of $MnO_2$ is 0.1–0.5 weight percent and containing 0.5–1 weight percent of $Nb_2O_5$.

8. Piezoelectric ceramic in accordance with claim 3, where 2 mole percent of said lead atoms are replaced

TABLE 1

| Sample No. | A | x (mol %) | B | y (mol %) | z (mol %) | $\alpha$ (% by weight) | $\rho$ ($\Omega \cdot cm$) | Kp (%) | Qmp | Fr-TC (ppm/°C.) | $\Delta Fr$ (kHz) | $\Delta Fa$ (kHz) |
|---|---|---|---|---|---|---|---|---|---|---|---|---|
| *1 | Sr | 1.0 | Ce | 3.0 | 49.0 | — | $2.1 \times 10^{12}$ | 54.3 | 91 | 20 | 3.46 | −5.48 |
| 2 | Sr | 1.0 | Ce | 3.0 | 49.0 | 0.1 | $4.7 \times 10^{10}$ | 57.6 | 94 | 55 | 0.46 | −0.77 |
| 3 | Sr | 1.0 | Pr | 3.0 | 52.0 | 0.1 | $5.1 \times 10^{10}$ | 48.2 | 98 | −10 | 0.32 | −0.57 |
| 4 | Sr | 1.0 | Nd | 3.0 | 52.0 | 0.1 | $5.5 \times 10^{10}$ | 49.7 | 99 | −25 | 0.26 | −0.61 |
| 5 | Sr | 5.0 | Sm | 1.0 | 49.0 | 0.1 | $4.3 \times 10^{10}$ | 47.5 | 100 | −90 | 0.64 | −0.84 |
| 6 | Sr | 5.0 | Eu | 1.0 | 49.0 | 0.1 | $4.3 \times 10^{10}$ | 48.1 | 98 | −95 | 0.74 | −0.81 |
| 7 | Sr | 5.0 | Gd | 1.0 | 49.0 | 0.1 | $4.2 \times 10^{10}$ | 47.6 | 97 | −95 | 0.68 | −0.79 |
| 8 | Ba, Ca | 1.0 each 2.0 in total | Ce, Nd, Sm | 1.0 each 3.0 in total | 47.0 | 0.2 | $5.4 \times 10^{10}$ | 59.3 | 87 | −90 | 0.96 | −0.98 |
| *9 | Sr | 1.0 | La | 6.0 | 49.0 | 0.1 | $8.8 \times 10^{10}$ | 61.2 | 70 | −110 | 1.86 | −3.86 |
| *10 | Sr | 10.0 | La | 2.0 | 49.0 | 0.1 | $5.1 \times 10^{10}$ | 50.1 | 92 | −170 | 1.43 | −2.97 |
| *11 | Sr | 1.0 | La | 1.0 | 44.0 | 0.1 | $7.5 \times 10^{10}$ | 42.1 | 77 | −440 | 3.41 | −4.26 |
| *12 | Sr | 1.0 | La | 1.0 | 55.0 | 0.1 | $7.2 \times 10^{10}$ | 32.5 | 95 | −120 | 0.22 | −0.52 |
| 13 | Sr | 3.0 | La | 2.0 | 50.0 | 0.5 | $2.1 \times 10^{10}$ | 49.1 | 75 | 20 | −0.31 | −0.99 |
| *14 | Sr | 3.0 | La | 2.0 | 50.0 | 1.0 | $4.5 \times 10^{11}$ | 43.2 | 280 | 240 | −1.26 | −5.75 |
| *15 | — | — | — | — | 48.0 | 0.1 | $2.3 \times 10^{10}$ | 44.3 | 105 | 470 | −2.44 | −4.57 |

TABLE 2

| Sample No. | A | x (mol %) | z (mol %) | B | $\beta$ (% by weight) | $\alpha$ (% by weight) | $\rho$ ($\Omega \cdot cm$) | Kp (%) | Qmp | Fr-TC (ppm/°C.) | $\Delta Fr$ (kHz) | $\Delta Fa$ (kHz) |
|---|---|---|---|---|---|---|---|---|---|---|---|---|
| *21 | Sr | 2.0 | 49.0 | Nb | 1.0 | — | $3.6 \times 10^{10}$ | 52.1 | 104 | 45 | 1.87 | −3.65 |
| 22 | Sr | 2.0 | 49.0 | Nb | 1.0 | 0.1 | $5.9 \times 10^{10}$ | 54.2 | 109 | 85 | 0.58 | −0.81 |
| 23 | Sr | 5.0 | 52.0 | Nb | 1.0 | 0.1 | $6.2 \times 10^{10}$ | 44.6 | 115 | −50 | 0.65 | −0.84 |
| *24 | Sr | 10.0 | 52.0 | Nb | 1.0 | 0.1 | $6.3 \times 10^{10}$ | 41.3 | 118 | −110 | 1.35 | −2.69 |
| 25 | Ba, Ca | 1.0 each 2.0 in total | 49.0 | Ta, Sb, W | 0.4 each 1.2 in total | 0.1 | $4.9 \times 10^{10}$ | 50.8 | 108 | −75 | 0.89 | −0.97 |
| 26 | Sr | 1.0 | 52.0 | Ta | 2.0 | 0.1 | $8.7 \times 10^{10}$ | 55.1 | 97 | −95 | 0.78 | −0.97 |
| *27 | Sr | 1.0 | 52.0 | Ta | 3.0 | 0.1 | $2.4 \times 10^{10}$ | 57.1 | 94 | −180 | 1.98 | −2.67 |
| *28 | Sr | 1.0 | 44.0 | Nb | 1.0 | 0.1 | $5.2 \times 10^{10}$ | 41.1 | 96 | −210 | 2.46 | −3.56 |
| 29 | Sr | 2.0 | 47.0 | Nb | 0.5 | 0.2 | $5.8 \times 10^{10}$ | 59.8 | 86 | −80 | 0.94 | −0.89 |
| *30 | Sr | 2.0 | 55.0 | Nb | 1.5 | 0.2 | $8.2 \times 10^{10}$ | 35.4 | 124 | −160 | 0.22 | −0.64 |
| 31 | Sr | 2.0 | 49.0 | Nb | 0.5 | 0.5 | $4.1 \times 10^{10}$ | 43.8 | 136 | −20 | −0.41 | −0.99 |
| *32 | Sr | 2.0 | 49.0 | Nb | 0.5 | 1.0 | $5.2 \times 10^{10}$ | 37.5 | 235 | 140 | −1.34 | −4.67 |
| *33 | — | — | 48.0 | — | — | 0.1 | $2.3 \times 10^{10}$ | 44.3 | 105 | 470 | −2.44 | −4.57 | with a combination of Ba and Ca and containing 1.2% of a combination of $Ta_2O_5$, $Sb_2O_3$ and $WO_3$.

9. Piezoelectric ceramic produced by diffusing $MnO_2$ at a temperature of 900°–1100° C. into a ceramic of the composition $PbZr_{1-z}Ti_zO_3$ where z is 0.45–0.54 and 0.1–8 mole percent of said lead atoms are replaced with at least one element selected from the group consisting of Ca, Sr and Ba, such that said piezoelectric ceramic contains Mn in the range of 0.005–0.9% by weight of the whole in terms of $MnO_2$, and said Mn exists at the boundary region of the ceramic particles at a higher concentration than in the ceramic particles of said piezoelectric ceramic.

10. Piezoelectric ceramic in accordance with claim 9, wherein an amount not exceeding 5.0 mole percent of said Pb atoms is replaced with at least one element selected from a group of La, Ce, Pr, Nd, Sm, Eu and Gd.

11. Piezoelectric ceramic in accordance with claim 9, wherein said at least one element selected from Sb, Nb, W and Ta is present in an amount not exceeding 2.9 percent by weight in terms of $Sb_2O_3$, $Nb_2O_5$, $WO_3$ and $Ta_2O_5$.

* * * * *